United States Patent
Ruohio et al.

(10) Patent No.: US 10,655,963 B2
(45) Date of Patent: May 19, 2020

(54) ANCHORING STRUCTURE FOR A SENSOR INSENSITIVE TO ANCHOR MOVEMENT

(71) Applicant: INVENSENSE, INC., San Jose, CA (US)

(72) Inventors: Jaakko Ruohio, Cusago (IT); Luca Coronato, Corsica (IT); Giacomo Gafforelli, Casatenovo (IT)

(73) Assignee: InvenSense, Inc., San Jose, CA (US)

( * ) Notice: Subject to any disclaimer, the term of this patent is extended or adjusted under 35 U.S.C. 154(b) by 194 days.

(21) Appl. No.: 15/899,906

(22) Filed: Feb. 20, 2018

(65) Prior Publication Data

US 2018/0238689 A1    Aug. 23, 2018

Related U.S. Application Data

(60) Provisional application No. 62/460,397, filed on Feb. 17, 2017.

(51) Int. Cl.
| | |
|---|---|
| *G01C 19/5712* | (2012.01) |
| *G01P 15/125* | (2006.01) |
| *G01C 19/574* | (2012.01) |
| *B81B 3/00* | (2006.01) |

(52) U.S. Cl.
CPC ........ *G01C 19/5712* (2013.01); *B81B 3/0059* (2013.01); *G01C 19/574* (2013.01); *G01P 15/125* (2013.01); *B81B 2201/0242* (2013.01); *B81B 2203/0154* (2013.01); *B81B 2203/0163* (2013.01); *B81B 2203/0307* (2013.01)

(58) Field of Classification Search
CPC .............. G01C 19/5712; G01C 19/574; G01C 19/5747; B81B 2201/0242; B81B 2203/0154; B81B 2203/0163; B81B 2203/0307; B81B 3/0059; G01P 15/125
See application file for complete search history.

(56) References Cited

U.S. PATENT DOCUMENTS

| | | | |
|---|---|---|---|
| 6,393,913 B1 * | 5/2002 | Dyck | G01P 15/0802 333/186 |
| 8,477,473 B1 | 7/2013 | Koury | |
| 9,725,309 B2 * | 8/2017 | Gonska | B81C 1/00238 |
| 2003/0172753 A1 | 9/2003 | Geen | |

(Continued)

FOREIGN PATENT DOCUMENTS

| | | |
|---|---|---|
| EP | 1309834 | 2/2002 |
| EP | 3312559 | 4/2018 |
| WO | WO2018152507 | 8/2018 |

OTHER PUBLICATIONS

PCT International Search Report for International Application No. PCT/US2019/028375, dated Aug. 1, 2019 (15 pages).

*Primary Examiner* — Francis C Gray
(74) *Attorney, Agent, or Firm* — Haley Guiliano LLP; Joshua Van Hoven

(57) ABSTRACT

A MEMS sensor includes a substrate and a MEMS layer. A plurality of anchoring points within the MEMS layer suspend a suspended spring-mass system that includes active micromechanical components that respond to a force of interest such as linear acceleration, angular velocity, pressure, or magnetic field. Springs and rigid masses couple the active components to the anchoring points, such that displacements of the anchoring points do not substantially cause the active components within the MEMS layer to move out-of-plane.

20 Claims, 7 Drawing Sheets

(56) References Cited

U.S. PATENT DOCUMENTS

| | | |
|---|---|---|
| 2010/0199764 A1 | 8/2010 | Hammer |
| 2011/0023604 A1* | 2/2011 | Cazzaniga ......... G01C 19/5712 |
| | | 73/514.32 |
| 2013/0068018 A1 | 3/2013 | Seeger |
| 2013/0104651 A1* | 5/2013 | Li ...................... G01C 19/5762 |
| | | 73/504.12 |
| 2013/0180332 A1* | 7/2013 | Jia ..................... G01C 19/5762 |
| | | 73/504.12 |
| 2013/0214367 A1* | 8/2013 | van der Heide ........ H01L 29/84 |
| | | 257/415 |
| 2014/0217929 A1* | 8/2014 | Lin ....................... H02N 1/006 |
| | | 318/116 |
| 2016/0377648 A1* | 12/2016 | Zhang .................. G01P 15/125 |
| | | 73/514.32 |
| 2018/0245920 A1* | 8/2018 | Laghi ................. G01C 19/5712 |

\* cited by examiner

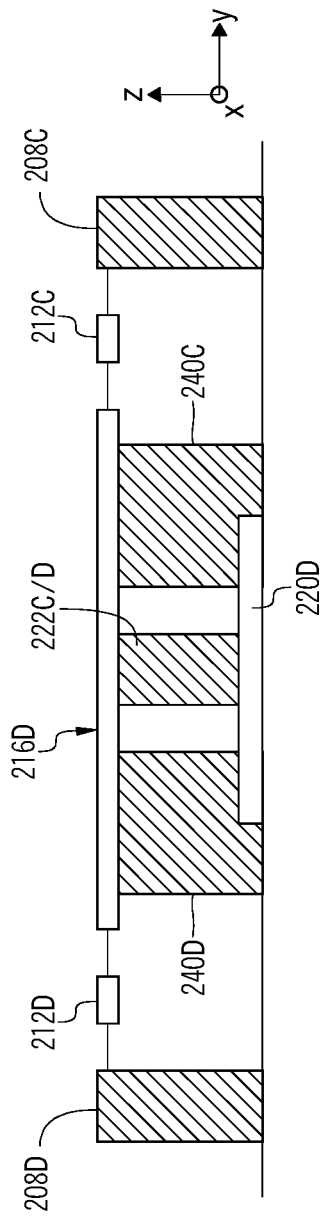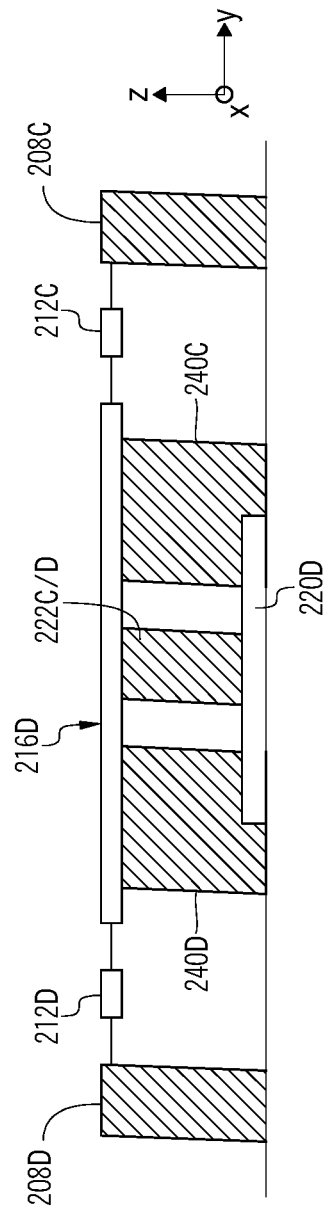

ANCHORING STRUCTURE FOR A SENSOR INSENSITIVE TO ANCHOR MOVEMENT

CROSS-REFERENCE TO RELATED APPLICATION

This application claims the benefit of U.S. Provisional Application No. 62/460,397, filed Feb. 17, 2017, which is hereby incorporated by reference herein in its entirety.

BACKGROUND

Numerous items such as smart phones, smart watches, tablets, automobiles, aerial drones, appliances, aircraft, exercise aids, and game controllers may utilize motion sensors during their operation. In many applications, various types of sensors such as accelerometers, gyroscopes, pressure sensors, and magnetometers may be analyzed independently or together in order to determine varied information for particular applications. For example, gyroscopes and accelerometers may be used in gaming applications (e.g., smart phones or game controllers) to capture complex movements by a user, drones and other aircraft may determine orientation based on gyroscope measurements (e.g., roll, pitch, and yaw), and vehicles may utilize measurements for determining direction (e.g., for dead reckoning) and safety (e.g., to recognizing skid or roll-over conditions).

Many sensors such as accelerometers, gyroscopes, pressure sensors, magnetometers, and microphones are implemented as microelectromechanical systems (MEMS) sensors. Micromechanical components of the sensor are fashioned using silicon fabrication techniques, and those micromechanical components respond (e.g., move) in response to certain external stimuli that are measured by the sensor, based on the design of the particular micromechanical components. The response of the micromechanical components to the external stimuli may be measured, e.g., by measuring the relative distance between the moving micromechanical components and fixed components of the sensor.

A MEMS sensor may be manufactured from a number of layers using semiconductor manufacturing techniques. The relative distance between components of the MEMS sensor may vary for different sensors based on manufacturing tolerances and similar factors. Further, a MEMS sensor may be packaged with other components in a manner that introduces stresses and other forces on the MEMS sensor and components and layers thereof. Environmental conditions and end-use environments may affect components of the MEMS sensor. These and other factors may cause components within the MEMS sensor to shift in a manner that changes the expected relative locations between sensor components, resulting in measurement errors.

SUMMARY OF THE INVENTION

In an embodiment of the present disclosure, an exemplary microelectromechanical (MEMS) sensor comprises at least one anchoring component and a spring-mass system suspended from the at least one anchoring component. The spring-mass system may comprise at least one sense mass, wherein the at least one sense mass moves in response to a sensed inertial force, and a rigid mass coupled to the at least one anchoring component by at least one anchoring spring, wherein the at least one sense mass is coupled to the at least one anchoring component via the rigid mass and the anchoring spring, and wherein the rigid mass is substantially stationary during the operation of the MEMS sensor and in response to the sensed inertial force.

In an embodiment of the present disclosure, an exemplary microelectromechanical (MEMS) sensor comprises a substrate and a MEMS layer located above the substrate layer. The MEMS layer may comprise an anchoring component and a rigid mass, wherein the anchoring component is coupled to the anchoring component by an anchoring spring, and wherein the anchoring spring is substantially compliant to a displacement of the anchoring component. The MEMS layer may further comprise an active mass coupled to the rigid mass by at least one spring, wherein the active mass is configured to move in response to a drive force or a sense force applied to the MEMS sensor, and wherein a lower plane of the active mass is substantially parallel to the substrate in response to the displacement of the anchoring component.

In an embodiment of the present disclosure, an exemplary microelectromechanical (MEMS) sensor comprises a substrate and a MEMS layer. The MEMS layer may comprise a plurality of anchoring components, wherein one or more of the plurality of anchoring components is located at an angle relative to the upper or lower plane of the MEMS layer. The MEMS layer may further comprise a plurality of active masses, wherein each of the plurality of active masses is configured to move in response to a drive force or a sense force applied to the MEMS sensor. The MEMS layer may further comprise a plurality of rigid masses, wherein one or more of the plurality of rigid masses is directly coupled to one or more the anchoring components by an anchoring spring, wherein one or more of the plurality of rigid masses is directly coupled to one or more of the active masses by a spring, wherein none of the active masses is directly coupled to any of the plurality of anchoring components, and wherein each of the plurality of active masses includes a plane that faces the substrate and is substantially parallel to the substrate.

BRIEF DESCRIPTION OF THE DRAWINGS

The above and other features of the present disclosure, its nature and various advantages will be more apparent upon consideration of the following detailed description, taken in conjunction with the accompanying drawings in which:

FIGS. 4A-4B show illustrative side views of the sensor of FIG. 2 in accordance with an embodiment of the present disclosure;

DETAILED DESCRIPTION

An exemplary MEMS sensor may include a substrate and a MEMS layer. Electrodes may be formed on a surface of the substrate and the MEMS layer may be designed to be located parallel to the top surface of the electrodes and the substrate. The MEMS layer includes anchor points that are fixed within the MEMS sensor, such as by bonding to a frame of the MEMS layer or to the substrate and/or a cap layer. Movable components of the MEMS sensor may be patterned within the MEMS layer to form springs and masses that are suspended from the anchors. Collectively, these suspended components may form a suspended spring-mass system.

Active components of the movable components of the suspended spring-mass system may be designed to move in-plane (e.g., within the MEMS layer) or out of plane (e.g., out of the MEMS layer, towards or away from the substrate) in response to applied drive forces, sensed forces, or both. Measurement of a sensed parameter such as linear acceleration, angular velocity, pressure, or magnetic field may be based on the proper movement of these active components within the MEMS layer and relative to other portions of the MEMS sensor such as the electrodes located on the substrate. If the active components are not properly located within the MEMS layer, the sensor may not function properly and sensed values may be scaled improperly.

The anchors that suspend the suspended spring-mass system may be displaced within the MEMS layer by a variety of causes, such as manufacturing tolerances, installation with other components, and end-use physical and environmental conditions. Rigid masses are coupled to the anchors by anchoring springs and to active components by springs. The anchoring springs may be substantially more flexible to one or more directional or torsional movements than the rigid mass. The active components are not directly coupled to the anchors. Any displacement of the anchors is substantially absorbed by the anchoring springs, and is not propagated by the rigid masses to the active components. The active components may remain substantially stationary within the MEMS layer despite the displacement of the anchor.

Figure 1:
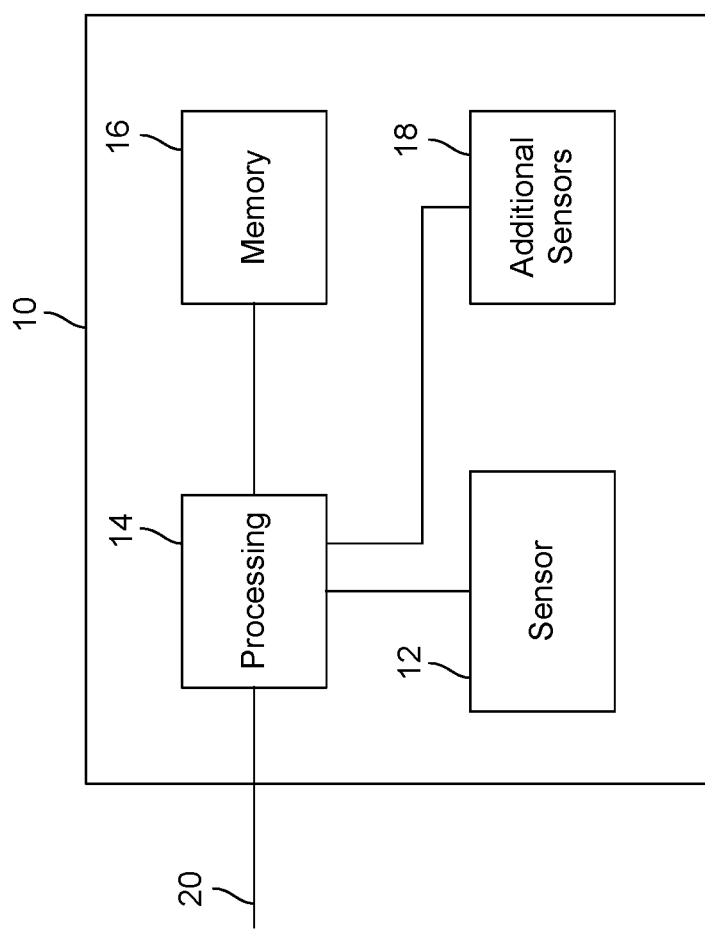
FIG. 1 shows an illustrative motion processing system in accordance with an embodiment of the present disclosure.

FIG. 1 depicts an exemplary motion processing system 10 in accordance with some embodiments of the present disclosure. Although particular components are depicted in FIG. 1, it will be understood that any suitable combination of sensors, processing components, memory, and other circuitry may be utilized as necessary for different applications and systems. In an embodiment as described herein, the motion processing system may include one or more sensors 12 and supporting circuitry, such as processing circuitry 14 and memory 16. In some embodiments, one or more additional sensors 18 (e.g., additional MEMS gyroscopes, MEMS accelerometers, MEMS microphones, MEMS pressure sensors, MEMS magnetometers, etc.) may be included within the motion processing system 10 to provide an integrated motion processing unit ("MPU") (e.g., including 3 axes of MEMS gyroscope sensing, 3 axes of MEMS accelerometer sensing, microphone, pressure sensor, and compass).

Processing circuitry 14 may include one or more components providing necessary processing based on the requirements of the motion processing system 10. In some embodiments, processing circuitry 14 may include hardware control logic that may be integrated within a chip of a sensor (e.g., on a substrate or cap of a MEMS sensor, or on a portion of a chip that is adjacent to the sensor) such as the sensor 12 to control the operation of the sensor 12 and perform aspects of processing for the sensor 12. In some embodiments, the sensor 12 may include one or more registers that allow aspects of the operation of hardware control logic to be modified (e.g., by modifying a value of a register). Other sensors 18 may operate in a similar manner. In some embodiments, processing circuitry 14 may also include a processor such as a microprocessor that executes software instructions, e.g., that are stored in memory 16. The microprocessor may control the operation of the sensor 12 by interacting with the hardware control logic, and process measurement signals received from sensor 12. The microprocessor may interact with other sensors in a similar manner.

Although in some embodiments (not depicted in FIG. 1), the sensor 12 or other sensors 18 may communicate directly with external circuitry (e.g., via a serial bus or direct connection to sensor outputs and control inputs), in an embodiment the processing circuitry 14 may process data received from the sensor 12 and other sensors 18 and communicate with external components via a communication interface 20 (e.g., a SPI or I2C bus, or in automotive applications, a controller area network (CAN) or Local Interconnect Network (LIN) bus). The processing circuitry 14 may convert signals received from the sensor 12 and other sensors 18 into appropriate measurement units (e.g., based on settings provided by other computing units communicating over the communication bus 20) and perform more complex processing to determine measurements such as orientation or Euler angles, and in some embodiments, to determine from sensor data whether a particular activity (e.g., walking, running, braking, skidding, rolling, etc.) is taking place.

In some embodiments, certain types of information may be determined based on data from multiple sensors, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

An exemplary MEMS sensor (e.g., sensor 12 and sensors 18) may be fabricated using semiconductor manufacturing processes. In some embodiments, a MEMS sensor may include a number of semiconductor layers that are formed into a single functional unit (e.g., a MEMS chip) including one or more MEMS sensors. Some or all layers may be formed to include mechanical and electrical components, such as micromechanical components of MEMS sensors, analog and digital circuitry, signal traces, capacitors, etc. The layers may be manufactured into a single functional unit by suitable processes such as semiconductor bonding.

In an exemplary embodiment, a MEMS sensor may be constructed of a MEMS layer that includes the movable micromechanical components of the MEMS sensor (e.g., of an accelerometer, gyroscope, pressure sensor, magnetometer and/or microphones). The movable micromechanical components of the MEMS sensor may be enclosed within a volume defined by other layers that are bonded to the MEMS layer and/or by other portions of the MEMS layer. In an exemplary embodiment, portions of the MEMS layer may be bonded to a cap layer from above and/or to a substrate layer below to form the MEMS sensor chip. In some embodiments, one or both of the cap and substrate layer may include electrical components formed thereon and/or therein, such as electrodes, analog and digital circuitry, signal traces, etc. The movable micromechanical components of the MEMS layer may be suspended within the MEMS layer at one or more anchoring points. Each anchoring point of the MEMS layer may be a portion of the MEMS layer that is fixedly attached to the stationary portions of the MEMS sensor, such as to one or more posts that extend from one or both of the substrate and cap layer, or a frame of the MEMS layer that is fixedly attached (e.g., by bonding) to one or both of the cap and substrate layer.

The movable micromechanical components within the MEMS layer may be suspended from the anchors by one or more masses that are patterned to be at least partially flexible (i.e., springs) along or about one or more axes (e.g., in one or more of the x-y-z directions or torsionally about one or more of the x-y-z axes). The masses and springs that are suspended from the anchors form a suspended spring-mass system and are designed to have a primary movement in response to the parameter and direction being measured, such as linear acceleration, angular velocity, pressure, or magnetic field. In some embodiments, the parameter that is being measured is determined based on the absolute or relative distance of one or more masses of the suspended spring-mass system to one or more fixed portions of the MEMS sensor, either within the MEMS layer or on another layer of the MEMS sensor.

In some instances, the relative locations of anchors that suspend the suspended spring-mass system relative to other components and layers of the system may diverge from a designed or expected location, for example, due to manufacturing tolerances and variances, installation with other components in a device, end-use applications, environmental conditions, device wear, and other similar factors. This resulting displacement may cause errors in measurement of a desired parameter based on incorrect scaling factors and other assumptions that are related to the expected location of the masses.

In some embodiments of the present disclosure, an anchoring structure may be employed within the suspended spring-mass system to prevent undesired displacement of the suspended spring-mass system. Even though other components of the MEMS sensor (e.g., directly anchored components) may experience undesired forces, the functional movable components within the suspended spring-mass system may be insensitive to the undesired forces such that they remain substantially within the desired location within the MEMS layer (e.g., such that the movable components or connection points thereto experience a displacement at least an order of magnitude less than directly anchored components). Although a gyroscope may be described herein as a particular type of MEMS sensor incorporating insensitive anchoring in some embodiments of the present disclosure, it will be understood that the principles and components described herein may be similarly applied to other sensor types such as accelerometers, pressure sensors, magnetometers, and microphones.

A MEMS gyroscope may typically have a plurality of micromechanical components that are used in order to measure rotation about an axis (e.g., pitch, roll, and/or yaw). The micromechanical components may include a plurality of masses, combs, electrodes, levers, arms, springs, and other similar components, situated in a MEMS device plane of the gyroscope (e.g., as a suspended spring-mass system). One or more of the micromechanical components are caused to vibrate, typically through an electrostatic drive system such as drive electrodes or drive combs. The components (e.g., a drive mass) are caused to vibrate at a drive frequency in a drive axis. Although it may be possible to measure rotation from the drive mass, in many gyroscopes a number of masses (e.g., Coriolis masses, proof masses, sense masses, etc.) are coupled to each other by springs and masses (e.g., lever arms, coupling masses, etc.) which often restrict the freedom of motion of the masses in certain directions based on the spring design (e.g., spring rigidity, torsion spring, etc.) and placement.

The design of the springs and masses of the suspended spring-mass system may be configured such that the proof mass and other components are restricted to moving primarily in only certain directions. A drive mass may be restricted to move primarily along a drive axis within the MEMS device plane. In an embodiment, a proof mass may be caused to move along a sense drive axis by the drive motion. In an exemplary embodiment of a roll or pitch sensor in which the proof mass is driven that moves within the MEMS device plane along the sense drive axis, the proof mass and other components coupled thereto (e.g., a lever arm as described herein) may move out of plane in response to rotation about the measured axis (e.g., in response to a Coriolis force that is perpendicular to both the measured axis and sense drive axis, in response to rotation about the measured axis). Whether the proof masses respond to rotation about the roll axis/x-axis (i.e., measured axis is the x-axis) or the pitch axis/y-axis (i.e., measured axis is the y-axis) depends on the sensor design and the orientation of the sensor relative to the x and y axes.

Sensing elements such as sense electrodes may be located in a plane that is parallel to the MEMS device plane, such as on the surface of a substrate formed by an underlying CMOS substrate layer of the gyroscope. Each proof mass and its respective sense electrode may form a capacitor, the capacitance of which varies based on the relative distance between each proof mass and its associated sense electrode. In a suspended spring-mass system in which a plurality of proof masses move differentially with respect to the sense electrodes (e.g., each proof mass is associated with one or more other proof masses that move in the opposite direction relative to the sense electrodes in response to a Coriolis force), one of the proof masses will be moving closer to its associated electrode (resulting in an increase in capacitance) while a differential proof mass will be moving away from its associated electrode (resulting in a decrease in capacitance). Signals representative of the capacitances may be compared and analyzed to determine angular velocity about the measured rotational axis, based on known scaling factors between angular velocity and the measured differential capacitance.

Figure 2:
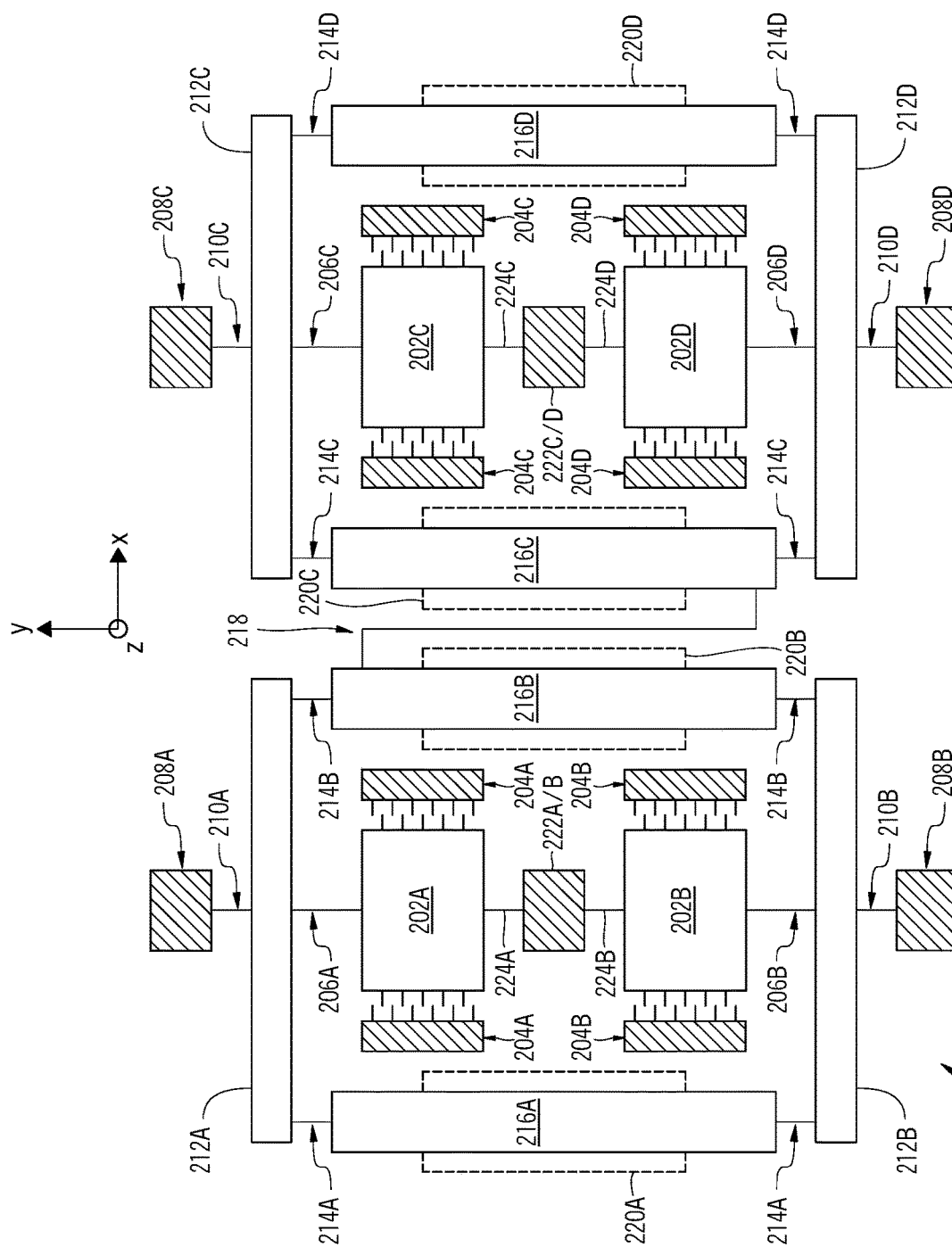
FIG. 2 shows an illustrative sensor design in accordance with an embodiment of the present disclosure.

FIG. 2 shows an illustrative gyroscope design in accordance with an embodiment of the present disclosure. Although the gyroscope of FIG. 2 may include any suitable components, in an exemplary embodiment the gyroscope of FIG. 2 may include drive masses 202a, 202b, 202c, and 202d; lever anchors 208a, 208b, 208c, and 208d; lever arms 212a, 212b, 212c, and 212d; proof masses 216a, 216b, 216c, and 216d; drive anchors 222a/b and 222c/d; and a number of springs and actuators as described herein. Each of these components may be located (e.g., suspended) within a MEMS device plane that defines an x-axis and y-axis in the plane, and a z-axis perpendicular to the plane. A substrate may be located in a plane that is parallel to the MEMS device plane (e.g., below the MEMS device plane), and in some embodiments, may include sensing elements (e.g., electrostatic electrodes 220a, 220b, 220c, and 220d), CMOS circuitry within the substrate layer, and a variety of anchored components that extend from the substrate into the MEMS device plane to provide anchors, actuators, and other components for suspending and operating the MEMS gyroscope.

Each of the drive masses 202a, 202b, 202c, and 202d may have a respective drive motion imparted on the drive mass in a respective drive direction, as described herein. Although any suitable actuation method may be used in accordance with the present disclosure, in an embodiment the drive masses may be caused to move in the drive direction by respective electrostatic actuators 204a, 204b, 204c, and 204d. In the exemplary embodiment depicted in FIG. 2, the electrostatic actuators 204a, 204b, 204c, and 204d may anchored to the substrate and extend therefrom into the MEMS device plane. The electrostatic actuators may be located relative to the drive masses in a manner such that drive masses (which are movable within the MEMS device plane) are caused to oscillate within the MEMS device plane in a drive direction along the x-axis. Although any suitable electrostatic actuation may be used in accordance with the present disclosure, in an embodiment each drive mass and its associated actuators may form a comb drive, with interdigitated comb fingers extending from each drive mass and its associated actuators. Drive masses 202a, 202b, 202c, and 202d may be each be suspended from respective anchors 222a/b and 222c/d by respective springs 224a, 224b, 224c, and 224d, which are compliant along a drive axis (e.g., the x-axis) and rigid along other axes, in order to facilitate movement of the drive masses along the drive axis.

Each of the drive masses may be coupled to a respective lever arm via a respective spring (e.g., such that drive mass 202a is coupled to lever arm 212a via spring 206a, drive mass 202b is coupled to lever arm 212b via spring 206b, drive mass 202c is coupled to lever arm 212c via spring 206c, and drive mass 202d is coupled to lever arm 212d via spring 206d). In an embodiment, each of springs 206a, 206b, 206c, and 206d may comprise one or more springs and/or masses that are coupled and configured such that the drive motion of the drive masses causes a rotation of a respective lever arm. Although the springs 206a, 206b, 206c, and 206d may perform this function in a variety of manners, in an embodiment the springs may be torsionally compliant to allow movement of the lever arm and proof masses out of the MEMS device plane (e.g., in the z-axis direction) in response to a Coriolis force due to rotation about the measured axis (e.g., the x-axis). In an embodiment, although the spring may be partially compliant along the drive axis, the spring may have sufficient width (e.g., along the x-axis axis) such that each lever arm is pulled along the drive axis in response to the respective motion of its associated drive mass.

In an embodiment, each of the lever arms may translate the drive motion applied along a first axis (e.g., the x-axis in FIG. 2) to a sense drive motion along a perpendicular axis, by being anchored and suspended in a manner that results in an in-plane rotation within the MEMS device plane. Although a suitable lever arm can include multiple interconnected masses and springs suspended in a suitable manner to translate the drive motion to a perpendicular sense drive motion, in an embodiment each lever arm may be suspended from a respective anchor by a spring located at the approximate center of the lever arm and along a shared axis with the respective spring coupled to the drive mass when the gyroscope is not being driven (e.g. as depicted in FIG. 2). Thus, spring 210a may share an axis with spring 206a and suspend lever arm 212a from anchor 208a, spring 210b may share an axis with spring 206b and suspend lever arm 212b from anchor 208b, spring 210c may share an axis with spring 206c and suspend lever arm 212c from anchor 208c, and spring 210d may share an axis with spring 206d and suspend lever arm 212d from anchor 208d. As described herein, the respective coupling of the lever arms to both the springs and the anchors (via the springs) may result in each lever arm rotating about its anchor in the MEMS device plane in response to a drive motion imparted by the drive masses via the springs. The rotation of each lever arm about each respective anchor may result in a motion at the end of each lever arm that is along the y-axis in the MEMS device plane.

Each lever arm may be coupled to one or more proof masses via one or more couplings. In an embodiment, each lever arm may be coupled to a proof mass at each end of the lever arm, such that in the embodiment of FIG. 2 lever arm 212a is coupled to proof mass 216a via proof mass spring 214a and to proof mass 216b via proof mass spring 214b, lever arm 212b is coupled to proof mass 216a via proof mass spring 214a and to proof mass 216b via proof mass spring 214b, lever arm 212c is coupled to proof mass 216c via proof mass spring 214c and to proof mass 216d via proof mass spring 214d, and lever arm 212d is coupled to proof mass 216c via proof mass spring 214c and to proof mass 216d via proof mass spring 214d. While each drive motion from each drive mass may be decoupled from the other drive masses, in an embodiment the drive motions may be coordinated such that the lever arms collectively cause each proof mass to move in the positive or negative y-direction, based on whether each pair of lever arms coupled to each proof mass are collectively rotating in a clockwise or counter-clockwise manner. The drive masses may be driven at a drive frequency, such that the lever arms and proof masses are driven to oscillate (rotationally for the lever arms, linearly for the proof masses) at the drive frequency.

As the proof masses are driven along the y-axis, they may experience a Coriolis force as the result of a rotation of the sensor about an axis that is perpendicular to the sense drive axis and in which movement of the proof masses is permitted by the gyroscope construction in configuration. In the exemplary gyroscope design of FIG. 2, the proof masses may experience an out-of-plane Coriolis force (e.g., along the z-axis) in response to a rotation about the measured axis (e.g., the x-axis), with the direction of the Coriolis force based on the direction of the sense drive motion (e.g., the y-axis) and the direction of rotation about the measured axis (e.g., the x-axis). The movement of the proof masses out of the MEMS device plane may be sensed in any suitable manner, such as electrostatic, piezoelectric, or optical sensing. In an exemplary embodiment of electrostatic sensing as depicted in FIG. 2, one or more electrodes may be located in parallel to the proof masses (e.g., on the substrate below the proof masses) to form a capacitor with each of the proof masses (e.g., electrode 220a forms a capacitor with proof mass 216a, electrode 220b forms a capacitor with proof mass 216b, electrode 220c forms a capacitor with proof mass 216c, and electrode 220d forms a capacitor with proof mass 216d). The capacitance of each of the proof masses may change based on the relative distance between each proof mass and its associated sense electrodes. In the exemplary embodiment of FIG. 2, the changes in capacitance may be sensed differentially. As described herein, based on the drive mode and configuration of the exemplary gyroscope described herein, a movement of one or more masses out-of-plane away from the substrate may correspond to a movement of another of the one or more proof masses out-of-plane towards the substrate.

The exemplary gyroscope of FIG. 2 may include two similar gyroscope portions, each including a similar number and configuration of drive masses, lever arms, and proof masses. Although two drive masses, lever arms, and proof masses are depicted in FIG. 2, it will be understood that other numbers and configurations of proof masses may be possible in other embodiments. In the exemplary embodiment of FIG. 2, each gyroscope portion includes a respective drive system (e.g., including two drive masses, two first springs, two lever arms, and two additional springs) and a respective sense system (e.g., including two sense springs and two proof masses). A coupling spring 218 may couple the two gyroscope portions together, such that the drive sense motion and Coriolis response of the gyroscope portions are coupled, resulting in proof masses 216b and 216c moving together in anti-phase to proof masses 216a and 216d.

As described herein, drive masses 202a-202d may be driven to oscillate along the x-axis with two of the masses moving in anti-phase from the other two masses. This drive motion results in lever arms 202a and 202b rotating clockwise and counterclockwise in unison while lever arms 202c and 202d similarly rotate in unison. These rotations of the lever arms in turn cause proof mass 216a to move in anti-phase to proof mass 216b and proof mass 216c to move in anti-phase to proof mass 216d. As long as the suspended spring-mass system is properly located parallel to the substrate, the motion of all of the drive masses, lever arms, and proof masses is within the MEMS layer, such that none of these components move relative to the substrate or substrate electrodes during operation in the absence of an external force. The drive and sense motion of an exemplary MEMS sensor are described in further detail in U.S. patent application Ser. No. 15/232,463, entitled OUT OF PLANE SENSING GYROSCOPE ROBUST TO EXTERNAL ACCELERATION AND ROTATION and filed Apr. 4, 2017, which is herein in incorporated by reference in its entirety. However, if the suspended spring-mass system is displaced relative to the substrate (i.e., such that the bottom plane of the suspended spring-mass system is no longer parallel to the substrate), the drive motion or response to external forces causes the components to move relative to the substrate even in the absence of an external force.

Figure 3A:
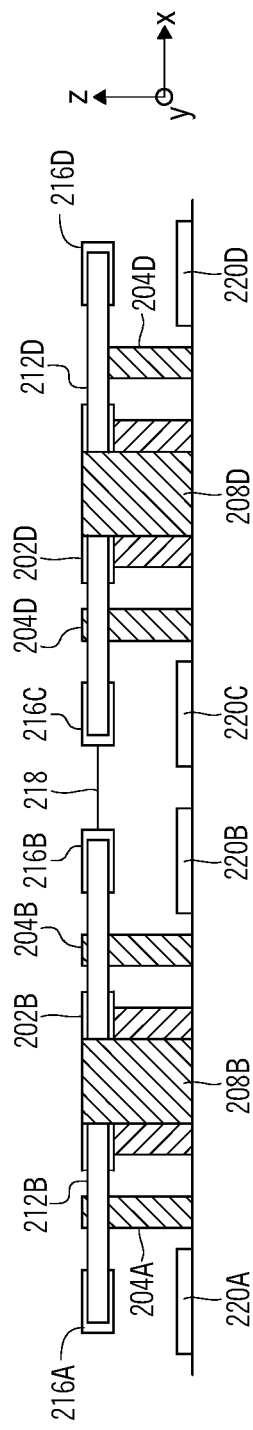
FIGS. 3A-3C show illustrative front views of the sensor of FIG. 2 in accordance with an embodiment of the present disclosure.

FIG. 3A shows an illustrative front view of the sensor of FIG. 2 in accordance with an embodiment of the present disclosure. In the illustrative front view of FIG. 3A, anchors are depicted with diagonal lines while other components (e.g., the suspended spring-mass system and electrodes) are depicted without diagonal lines. Components may not be depicted to scale for ease of illustration. In the exemplary embodiment of FIG. 3A, the anchors and MEMS layer may substantially conform to a desired location and configuration, such that a bottom plane of the suspended spring-mass system of the MEMS layer is located parallel to the upper plane of the substrate and the electrodes located thereon.

Lever anchors 208b and 208d may extend from the substrate of the sensor into the MEMS plane, and in the embodiment of FIG. 3A, may extend such that the anchors 208b and 208d are substantially perpendicular to each of the substrate and the MEMS layer. Lever arm 212b is directly suspended from anchor 208b by spring 210b (not visible in FIG. 3A) while lever arm 212d is directly suspended from anchor 208d by spring 210d (not visible in FIG. 3A). Because of the perpendicular alignment of the anchors 208b and 208d to the substrate and the MEMS layer, the lower planes of the suspended lever arms 212b and 212d are perpendicular to the upper plane of the substrate. In the exemplary embodiment of FIG. 3A, anchors 208a and 208c, springs 210a and 210c, and lever arms 212a and 212c may be similarly aligned and located.

Drive anchors 222a/b and 222c/d may extend from the substrate of the sensor into the MEMS plane, and in the embodiment of FIG. 3A, may extend such that the anchors 222a/b and 222c/d are substantially perpendicular to each of the substrate and the MEMS layer. Drive masses 202a and 202b (not visible in FIG. 3A) are directly suspended from anchor 222a/b by springs 224a and 224b respectively, while drive masses 202c and 202d (not visible in FIG. 3A) are directly suspended from anchor 222c/d by springs 224c and 224d respectively. Because of the perpendicular alignment of the anchors 222a/b and 222c/d to the substrate and the MEMS layer, the lower planes of the suspended drive masses 202a-d are perpendicular to the upper plane of the substrate. Anchors for electrostatic actuators 204b and 204d are also depicted in FIG. 3A and are aligned with the drive masses within the MEMS layer.

Proof mass 216a may be suspended from lever arms 212a and 212b via springs 214a and 214b, proof mass 216b may be suspended from lever arms 212a and 212b via springs 214a and 214b, proof mass 216c may be suspended from lever arms 212c and 212d via springs 214c and 214d, and proof mass 216d may be suspended from lever arms 212c and 212d via springs 214c and 214d. Because each of the lever arms 212a-212d is suspended parallel to the substrate, each of the proof masses 216a-216d is suspended over and parallel to its associated electrode 220a-220d.

Figure 3B:
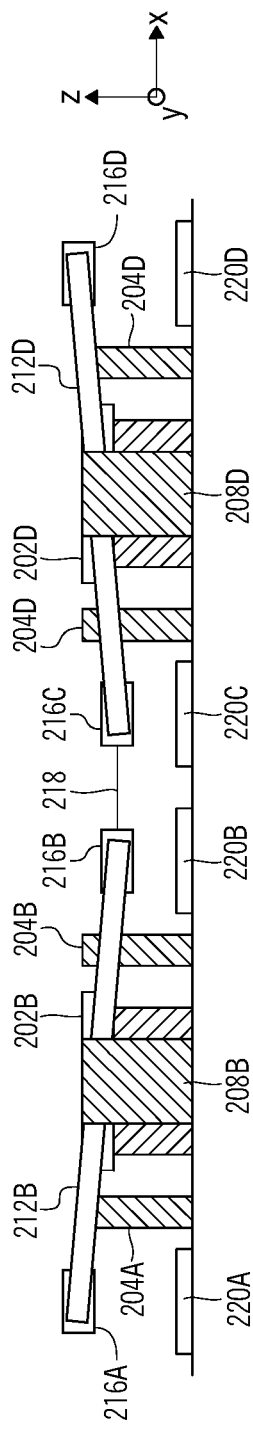

FIG. 3B shows an illustrative front view of the sensor of FIG. 2 and FIG. 3A subject to a measured angular velocity in accordance with an embodiment of the present disclosure. As described herein, when the anti-phase x-axis translation of the drive masses 202a-202d causes the anti-phase rotation of the lever arms 212a-212d and the anti-phase y-axis translation of the proof masses 216a-216d, the proof masses 216a-216d may experience a Coriolis force in response to an angular velocity about the x-axis.

The Coriolis force acts in the positive or negative z-axis direction upon the current direction of the y-axis translation of each proof mass and the direction of the rotation about the x-axis. The magnitude of the z-axis translation may correspond to the angular velocity about the x-axis. In the exemplary embodiment of FIG. 3B, proof masses 216b and 216c translate in the negative z-direction while proof masses 216a and 216d translate in the positive z-direction. In the exemplary embodiment of FIG. 3B, the movement of the respective proof masses 216a-216d is balanced, such that the proof masses 216a and 216d are the same distance away from the electrodes 220a and 220d, and the proof masses 216b and 216c are the same distance away from the electrodes 220b and 220c. With respect to the original parallel distance depicted in FIG. 3A, the increase in distance of proof masses 216a and 216d to electrodes 220a and 220d is the same as the decrease in distance of proof masses 216b and 216c to electrodes 220b and 220c.

Figure 3C:
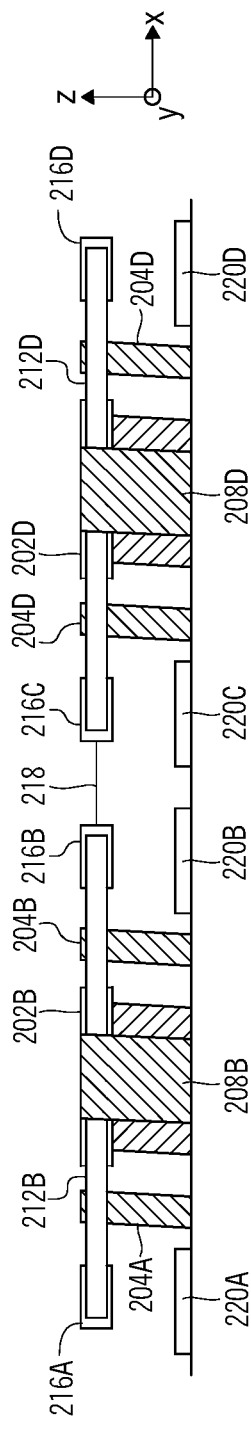

FIG. 3C shows an illustrative front view of the sensor of FIG. 2 and FIG. 3A subject to a displacement of anchors within the MEMS layer relative to the substrate layer in accordance with an embodiment of the present disclosure. As described herein, a variety of causes can result in a displacement of some or all portions of MEMS sensors, such as anchors and bonded frames within MEMS layers in MEMS sensor. In the exemplary embodiment of FIG. 3C, each of the anchors of the MEMS sensor is displaced such that the anchor forms an angle with respect to the MEMS layer and the substrate layer. Although the anchors of FIG. 3C are depicted as being displaced in a substantially uniform manner, it will be understood that the anchors may be displaced in a non-uniform manner.

The relative location and angular displacement of the lever anchors 208b and 208d may cause the springs 210b and 210d to impart a force on lever arms 212b and 212d. In the exemplary embodiment of FIG. 3C, this may cause lever arm 212b to experience a movement along the x-axis with respect to anchor 208b and spring 210b, and may cause lever arm 212d to experience a movement along the x-axis with respect to anchor 208d and spring 210d. This movement may cause the lever arms to shift partially out of the parallel MEMS plane (not depicted in FIG. 3C) such that the lower plane of the each of the lever arms forms an angle with the substrate. The proof masses 216a-216d may move closer or farther away from their associated electrodes in response to the movement of the lever arms or other external forces as they move in the sense mode with out-of-plane movement. The resulting quadrature may result in measurement errors (e.g., offset errors) for angular velocity due to phase error, as the absolute and relative position and movement of the proof masses relative to the electrodes may diverge significantly from designed parameters. Because the lever arms move at least partially out of plane in response to the drive motion or other forces, the resulting proof mass movement is not optimized for generating a desired Coriolis force in response to an angular velocity about the x-axis. Although FIG. 3C depicts a uniform displacement angle for the anchors, different lever arms may be impacted differently by different anchor displacement, resulting in complex out of plane motion and coupling between proof masses.

FIG. 4A shows an illustrative side view of the sensor of FIG. 2 in accordance with an embodiment of the present disclosure. In the illustrative side view of FIG. 4A, anchors are depicted with diagonal lines while other components (e.g., suspended spring-mass system and electrodes) are depicted without diagonal lines. Components may not be depicted to scale for ease of illustration. In the exemplary embodiment of FIG. 4A, the anchors and MEMS layer may substantially conform to a desired location and configuration, such that a bottom plane of the suspended spring-mass system of the MEMS layer is located parallel to the upper plane of the substrate and the electrodes located thereon.

Lever anchors 208c and 208d may extend from the substrate of the sensor into the MEMS plane, and in the embodiment of FIG. 4A, may extend such that the anchors 208c and 208d are substantially perpendicular to each of the substrate and the MEMS layer. Lever arm 212c is directly suspended from anchor 208c by spring 210c while lever arm 212d is directly suspended from anchor 208d by spring 210d. Because of the perpendicular alignment of the anchors 208c and 208d to the substrate and the MEMS layer, the lower planes of the suspended lever arms 212c and 212d are perpendicular to the upper plane of the substrate. In the exemplary embodiment of FIG. 4A, anchors 208a and 208b, springs 210a and 210b, and lever arms 212a and 212b may be similarly aligned and located.

Drive anchor 222c/d may extend from the substrate of the sensor into the MEMS plane, and in the embodiment of FIG. 4A, may extend such that the anchors 222c/d are substantially perpendicular to each of the substrate and the MEMS layer. Drive masses 202c and 202d (not visible in FIG. 4A) are directly suspended from anchor 222c/d by springs 224c and 224d respectively. Although not depicted in FIG. 4A, drive anchor 222a/b may similarly extend perpendicular to the substrate and MEMS layer such that drive masses 202a and 202d are directly suspended from anchor 222a/b by springs 224a and 224b respectively. Because of the perpendicular alignment of the anchors 222a/b and 222c/d to the substrate and the MEMS layer, the lower planes of the suspended drive masses 202a-d are perpendicular to the upper plane of the substrate. Anchors for electrostatic actuators 204c and 204d are also depicted in FIG. 4A and are aligned with the drive masses 202c and 202d within the MEMS layer.

As depicted in FIG. 4A, proof mass 216d may be suspended from lever arms 212c and 212d via springs 214d. Although not visible in FIG. 4A, proof mass 216a may be suspended from lever arms 212a and 212b via springs 214a, proof mass 216b may be suspended from lever arms 212a and 212b via springs 214b, and proof mass 216c may be suspended from lever arms 212c and 212d via springs 214c. Because each of the lever arms 212a-212d is suspended parallel to the substrate, each of the proof masses 216a-216d is suspended over and parallel to its associated electrode 220a-220d, as depicted in FIG. 4A for proof mass 216d and electrode 220d.

As described herein, when the anti-phase x-axis translation of the drive masses 202a-202d causes the anti-phase rotation of the lever arms 212a-212b and the anti-phase y-axis translation of the proof masses 216a-216d, the proof masses 216a-216d may experience a Coriolis force in response to an angular velocity about the x-axis. The Coriolis force acts in the positive or negative z-axis direction upon the current direction of the y-axis translation of each proof mass. The magnitude of the z-axis translation may correspond to the angular velocity about the x-axis. In the exemplary embodiment of FIG. 4A, proof mass 216d may move closer or farther away from electrode 220d depending on the y-axis drive direction of proof mass 216d and the direction of the angular velocity about the x-axis. The other proof masses 216a-216c may similarly move relative to respective electrodes 220a-220c.

FIG. 4B shows an illustrative side view of the sensor of FIG. 2 and FIG. 4A subject to a displacement of anchors within the MEMS layer relative to the substrate layer in accordance with an embodiment of the present disclosure. As described herein, a variety of causes can result in a displacement of some or all portions of MEMS sensors, such as anchors and bonded frames within MEMS layers in MEMS sensor. In the exemplary embodiment of FIG. 4B, each of the anchors of the MEMS sensor is displaced in a similar manner such that the anchor forms an angle with respect to the MEMS layer and the substrate layer. Although the anchors of FIG. 4B are depicted as being displaced in a substantially uniform manner, it will be understood that the anchors may be displaced in a non-uniform manner.

The relative location and angular displacement of the lever anchors 208c and 208d may cause the springs 210c and 210d to impart a force on lever arms 212c and 212d. In the exemplary embodiment of FIG. 4B, this may cause lever arm 212c to experience a movement along the y-axis with respect to anchor 208d and spring 210d, and may cause lever arm 212c to experience a movement along the y-axis with respect to anchor 208c and spring 210c. This movement may cause the lever arms to shift partially out of the parallel MEMS plane (not depicted in FIG. 4B) such that the lower plane of the each of the lever arms forms an angle with the substrate. The proof masses 216a-216d may move closer or farther away from their associated electrodes in response to the movement of the lever arms or other external forces as they move in the sense mode with out-of-plane movement. The resulting quadrature may result in measurement errors (e.g., offset errors) for angular velocity due to phase error, as the absolute and relative position and movement of the proof masses relative to the electrodes may diverge significantly from designed parameters. Because the lever arms move at least partially out of plane in response to the drive motion or other forces, the resulting proof mass movement is not optimized for generating a desired Coriolis force in response to an angular velocity about the x-axis. Although FIG. 4B depicts a uniform displacement angle for the anchors, different lever arms may be impacted differently by different anchor displacement, resulting in complex out of plane motion and coupling between proof masses.

Figure 5:
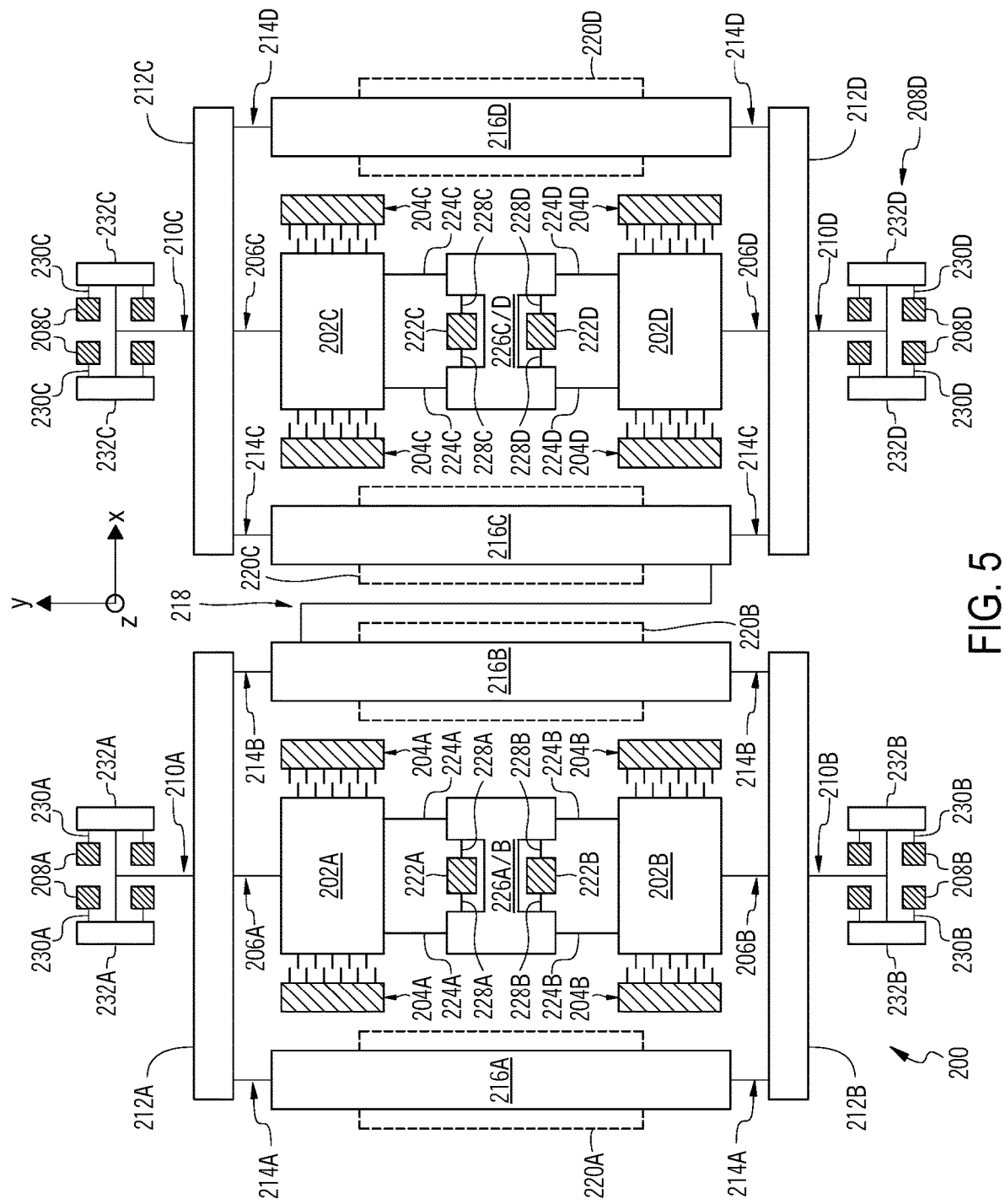
FIG. 5 shows an illustrative sensor design in accordance with an embodiment of the present disclosure.
Figure 6A:
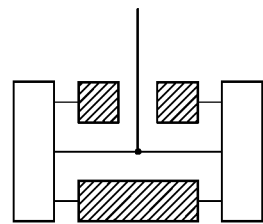
FIGS. 6A-6G shows illustrative anchoring configurations in accordance with some embodiments of the present disclosure.
Figure 6B:
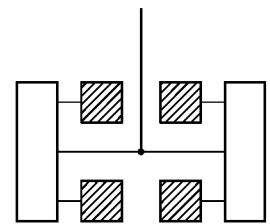
Figure 6C:
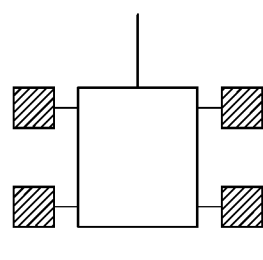
Figure 6D:
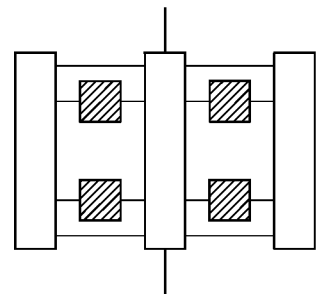
Figure 6E:
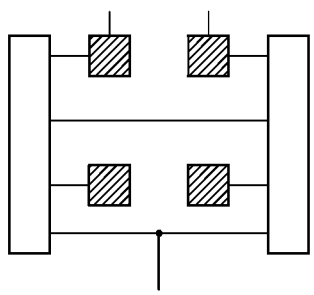
Figure 6F:
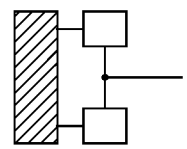
Figure 6G:
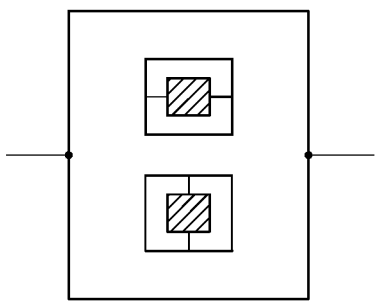

FIG. 5 shows an illustrative sensor design in accordance with an embodiment of the present disclosure. In the exemplary embodiment of FIG. 5, the configuration for lever anchors 208a-208b, springs 210a-210d, drive anchors 222a/b and 222c/d, and springs 224a-224d have been modified to incorporate features that reduce the sensitivity of the active components of the suspended spring-mass system (e.g., drive masses 202a-202d, lever arms 212a-212d, and proof masses 216a-216b) to conditions that result in displacement of anchors of the MEMS sensor. The exemplary MEMS sensor of FIG. 5 operates in a similar manner to the MEMS sensor of FIG. 2 under normal conditions.

In some embodiments, one or more of the anchors may be decoupled from the active MEMS components by one or more rigid masses and additional anchor springs. The rigid masses and anchor springs may be selected, connected, and configured in a manner that limits the likelihood of anchor displacement propagating to the active components of the suspended spring-mass system. In some embodiments, certain kinds of anchor displacements (e.g., due to shearing of bonded layers, manufacturing tolerances, integrations in end-use systems, etc.) such as shearing forces and angled displacements may be most likely to occur. As described in the present disclosure, springs may be selected for directional and/or torsional flexibility while the rigid masses are rigid in comparison to a flexible dimension of a spring (e.g., by an order or magnitude or more), in order to maintain structural integrity of the MEMS layer within the plane that is parallel to the substrate. For example, if it is known that a particular anchor is likely to experience a shearing stress that is likely to cause rotational movement of the suspended spring-mass system, torsionally compliant springs may be coupled between one or more anchors and the intervening rigid mass, such that the rigid mass remains substantially within the MEMS layer (i.e., such that any out-of-plane movement of the anchor is absorbed by the spring while the rigid mass remains substantially within the MEMS layer as designed). Springs may also be designed to be flexible in particular directions (e.g., x-or-y direction in-plane or z-direction out-of-plane) to accommodate particular expected anchor displacements, while the rigid mass provides structural stability within the MEMS layer as a non-active component. In this manner, substantially all of the deformation caused by any stresses on the anchors may be absorbed by the springs that are coupled to the anchors rather than the rigid mass.

Although in some embodiments only some of the anchors may be decoupled from the active components of the suspended spring-mass system, in the exemplary embodiment of FIG. 5 all of the anchors are decoupled from the active components of the suspended spring-mass system by at least one intervening rigid mass and a plurality of anchor springs.

In the exemplary embodiment of FIG. 5, each lever anchor 208a-208d is replaced with an anchoring system that includes a plurality of anchors 208a-208d, anchor springs 230a-230d, and rigid masses 232a-232d. In the embodiment of FIG. 5, each lever anchor 208a-208d may be replaced by four lever anchors 208a-208d, each of which is coupled to one of two adjacent rigid masses 232a-232d by a respective anchor spring 230a-230d. Although the exemplary embodiment of FIG. 5 depicts a certain number, size, location, and configuration of these components, it will be understood that modifications may be performed based on factors such as sensor type, sensor design, and likely anchor displacement problems. For example, different quantities of anchors and rigid masses may be selected (e.g., a 1:1, 4:3, 3:2, 3:1, 1:3, 2:3, or 3:4 ratio of anchors to rigid masses), placement of the anchors and rigid masses may be modified (e.g., placing some or all of the rigid masses between the anchors), a variety of patterns and shapes for anchors and masses may be implemented, and multiple spring types may be implemented in a variety of directions to facilitate anchor displacements of concern.

In the exemplary embodiment of the lever anchor 208a portion of FIG. 5, each of four lever anchors 208a is adjacent to one of two rigid masses 232a, such that the lever anchors 208a are located between the two rigid masses 232a. Each lever anchor 208a is directly coupled to its adjacent rigid mass 232a by an anchor spring 230a that extends along x-axis between the lever anchor 208a and the rigid mass 232a. The other lever anchor portions (e.g., lever anchor 208b/anchor spring 230b/rigid mass 232b, lever anchor 208c/anchor spring 230c/rigid mass 232c, and lever anchor 208d/anchor spring 230d/rigid mass 232d) are configured in a similar manner. In an embodiment, each anchor spring 230a-230d is torsionally compliant about the x-axis, such that lever anchor displacements about the x-axis are substantially absorbed by the springs 230a-230d. Each of the rigid masses 232a-232d is coupled to an associated lever arm 212a-212d via a T-shaped spring 210a-210b. In the exemplary embodiment of FIG. 5, springs 210a-210d are torsionally compliant about both the x-axis and y-axis, such that lever anchor displacements about these axes axis that are not substantially absorbed (e.g., as a strain/stress relief structure) by the anchor springs 230a-230d and rigid masses 232a-232d are absorbed propagated by springs 210a-210d.

In the exemplary embodiment of FIG. 5, each drive anchor 222a/b and 222c/d is replaced with an anchoring system that includes a plurality of drive anchors 222a-222d, anchor springs 228a-228d, and rigid masses 226a/b-226c/d. In the embodiment of FIG. 5, drive anchor 222a/b may be replaced by two drive anchors 222a and 222b, each of which is coupled to an adjacent rigid mass 226a/b by two respective anchor springs 228a or 228b. Drive anchor 222c/d may be replaced by two drive anchors 222c and 222d, each of which is coupled to an adjacent rigid mass 226c/d by two respective anchor springs 228c or 228d. Although the exemplary embodiment of FIG. 5 depicts a certain number, size, location, and configuration of these components, it will be understood that modifications may be performed based on factors such as sensor type, sensor design, and likely anchor displacement problems. For example, different quantities of anchors and rigid masses may be selected (e.g., a 1:1, 4:3, 3:2, 3:1, 1:3, 2:3, or 3:4 ratio of anchors to rigid masses), placement of the anchors and rigid masses may be modified (e.g., placing some or all of the rigid masses between the anchors), a variety of patterns and shapes for anchors and masses may be implemented, and multiple spring types may be implemented in a variety of directions to facilitate anchor displacements of concern.

In the exemplary embodiment of FIG. 5, two drive anchors 222a and 222b are adjacent to and partially surrounded by rigid mass 226a/b and coupled thereto by anchor springs 228a and 228b that extend along the x-axis, while drive anchors 222c and 222d are adjacent to and partially surrounded by rigid masses 226c/d and coupled thereto by anchor springs 228c and 228d that extend along the x-axis.

In an embodiment, each anchor spring 228 is torsionally compliant about the x-axis, such that lever anchor displacements about the x-axis are substantially absorbed by the spring 228. Rigid mass 226a/b may be coupled to drive masses by one or more springs, such as springs 224a-224d. In the exemplary embodiment of FIG. 5, springs 224a-224d are torsionally compliant about the y-axis, such that lever anchor displacements about the y-axis that are not substantially absorbed (e.g., as a strain/stress relief structure) by the anchor springs 228 and rigid masses 226 are substantially absorbed by springs 224.

FIG. 6 shows illustrative anchoring configurations of anchoring systems that are insensitive to anchor displacement in accordance with some embodiments of the present disclosure. The configurations depicted as (a)-(g) in FIG. 6 demonstrate exemplary modifications in number, size, shape, and orientation of anchors (illustrated with diagonal lines), springs, and rigid masses. It will be understood that these examples are provided by way of illustration and for purposes of limitation, and that the particular configurations depicted in FIG. 6 may be modified or combined in a variety of manners to accommodate particular applications based on factors such as expected anchor displacement and active components that are coupled to the anchors via the rigid masses (e.g., rotational moving masses, linear in-plane moving masses, out-of-plane masses, lever arms, drive masses, Coriolis masses, proof masses, etc.). Springs may be patterned (e.g., width, length, shape, folds, etc.) to accommodate desired features and responses to different anchor displacements and other causes of undesired MEMS layer displacements.

Figure 7:
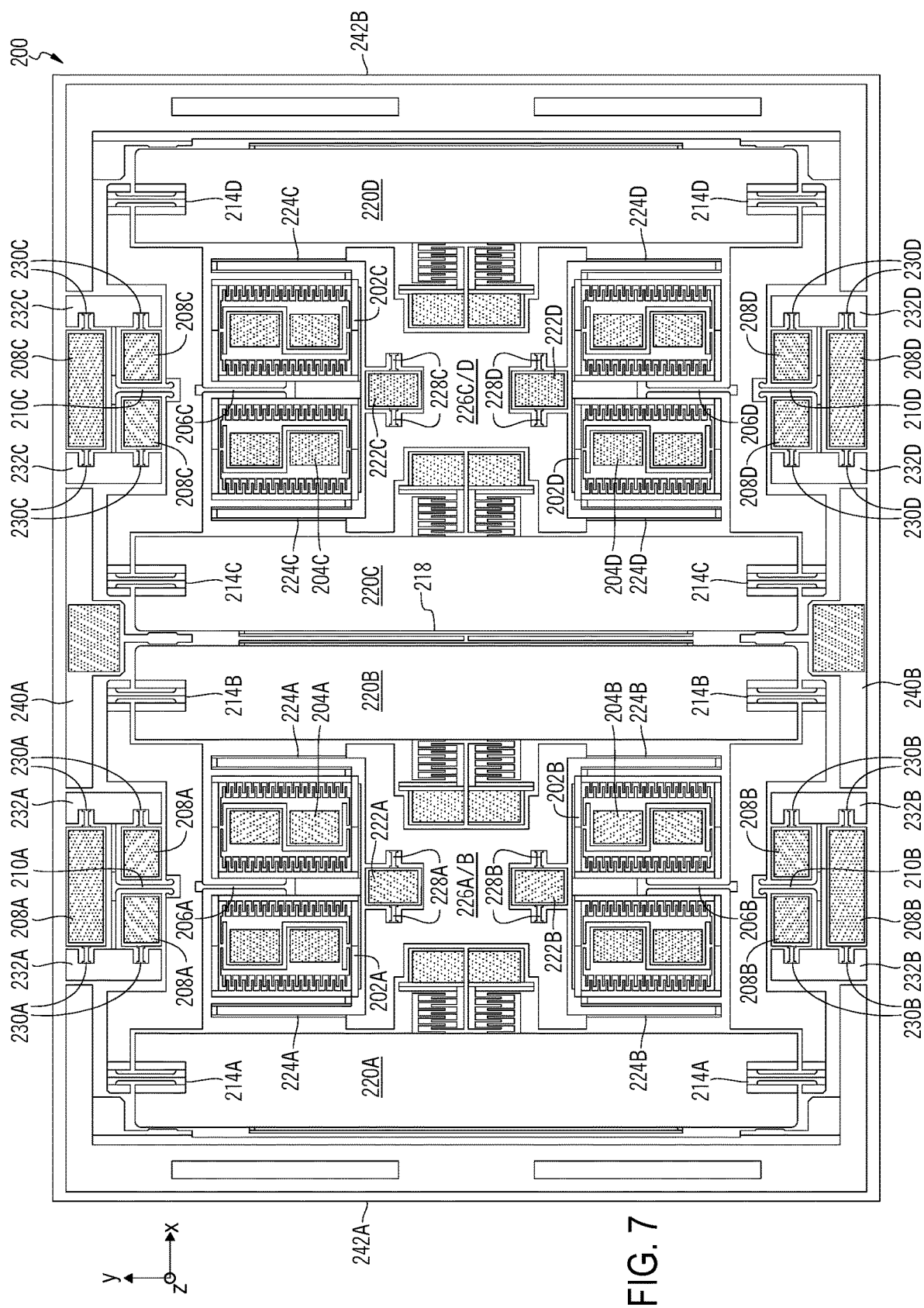
FIG. 7 shows an illustrative MEMS layer of an exemplary out-of-plane sensing MEMS gyroscope in accordance with an embodiment of the present disclosure.

FIG. 7 shows an illustrative MEMS layer of an exemplary out-of-plane sensing MEMS gyroscope in accordance with an embodiment of the present disclosure. Although numbering of components in FIG. 7 may generally conform to the numbering of similar items in FIGS. 2-5, it will be understood that components of FIG. 7 may be configured in a variety of different manners in accordance with the present disclosure, and that suitable modifications, additions, or removals from the structures depicted and described in FIG. 7 may be made as described herein or as understood by a person having ordinary skill in the art.

In an embodiment, the MEMS gyroscope of FIG. 7 may include a plurality of fixed anchored portions for suspending the suspended spring-mass system via the lever arms and drive masses and providing a frame within the MEMS layer. In the exemplary embodiment of FIG. 7, the fixed anchored portions may be bonded to one or both of the cap and the substrate of the MEMS sensor via anchors that extend from the cap and/or substrate. In the embodiment of FIG. 7, frame anchors 240a, 240b, 242a, and 242b may be located along the top side (frame anchor 240a on the positive y-axis side of the MEMS sensor), bottom side (frame anchor 240b on the negative y-axis side of the MEMS sensor), left side (frame anchor 242a on the negative x-axis side of the MEMS sensor), and right side (frame anchor 242b on the positive x-axis side of the MEMS sensor) of the MEMS sensor. In some embodiments, the frame anchors may serve to limit air gaps that may create resistance to movement in a desired (e.g., drive or sense) direction, may limit movement of movable MEMS components outside of desired directions of movement, and may provide a filler of the space such that an etching load does not vary much in the chip. In the exemplary embodiment of FIG. 7, the frame anchors are not coupled to any of the components of the suspended spring-mass system, although in some embodiments, some or all of the frame anchors may be coupled to portions of the suspended spring-mass system (e.g., via one or more anchor springs and/or rigid masses).

In the exemplary embodiment of FIG. 7, all of the active components of the suspended spring-mass system of the MEMS sensor are coupled to the anchors via rigid masses and associated anchor springs, such that each of the active components is decoupled from displacements from the anchors. Although different components may be suspended in different manners in different embodiments and for different sensor types, in the exemplary embodiment of FIG. 7 the drive masses are suspended from drive anchors via a set of rigid masses and associated anchor springs, the lever arms are suspended from lever anchors via a second set of rigid masses and associated anchor springs, and the proof masses are suspended from the lever arms.

In the embodiment of FIG. 7, exemplary lever anchors 208a are bonded to one or both of the substrate and cap to form a fixed portion of the MEMS layer. An outer lever anchor 208a extends between two rigid masses 232a and is directly coupled to each of the rigid masses 232a via anchor springs 230a that extend along the x-axis. Two inner lever anchors 208 are each directly coupled to one of the rigid masses 232a via anchor springs 230a that extend along the x-axis. Each of the anchor springs may be substantially torsionally compliant, such that displacements of the lever anchors about the x-axis are substantially absorbed by the springs 230a. The rigid masses 232a may be coupled to each other and to lever arm 212a via a T-shaped spring that extends between the lever anchors 208a. The T-shaped spring 210a may be torsionally compliant about both the x-axis and y-axis to limit propagation of anchor displacements to the lever arm 232a, and may be compliant to z-axis displacement based on the aspect ratio of spring 210a. Spring 210 may be coupled to a center point of lever arm 212a to provide a pivot point for lever arm 212a to rotate about in response to the x-axis drive motion of the drive mass 202a. Lever arms 212b-212d may similarly be coupled to rigid masses 232b-232d via springs 210a-210d, and via anchor springs 230b-230d to lever anchors 208b-208d.

In the embodiment of FIG. 7, exemplary drive anchors 222a and 222b are bonded to one or both of the substrate and cap to form a fixed portion of the MEMS layer. An upper drive anchor 222a is surrounded on three sides by rigid mass 226a/b and is directly coupled to rigid mass 226a/b via two anchor springs 228a that extend along the x-axis to the rigid mass 226a/b. A lower drive anchor 222b is surrounded on three sides by rigid mass 226a/b and is directly coupled to rigid mass 226a/b via two anchor springs 228b that extend along the x-axis to the rigid mass 226a/b. Rigid mass 226a/b is suspended within the MEMS layer from the drive anchors 222a and 222b. A plurality of upper springs 224a couple the rigid mass 226a/b to drive mass 202a and suspend the drive mass 202a within the MEMS layer. In an exemplary embodiment, upper springs 224a are folded springs that facilitate the x-axis drive motion of the drive mass 202a and are substantially rigid along the y-axis. A plurality of lower springs 224b couple the rigid mass 226a/b to drive mass 202b and suspend the drive mass 202b within the MEMS layer. In an exemplary embodiment, lower springs 224b are folded springs that facilitate the x-axis drive motion of the drive mass 202b and are substantially rigid along the y-axis. In this manner, the drive masses may generally be restricted from moving other than in the drive axis, preventing coupling of the drive motion, sense drive motion, and sense motion. Drive masses 202c-202d may similarly be coupled to rigid mass 226c/d via springs 224c-224d, and via springs 228c-228d to drive anchors 222c-222d.

In the exemplary embodiment of FIG. 6, each of the drive masses 202a/202b/202c/202d has two cavities formed therein, with each cavity having combs for interfacing with a comb-drive electrostatic actuator located therein. For example, drive mass 202a mas two cavities therein, each of which has a plurality of anchored electrostatic actuators 204a located therein for causing movement of the drive mass 202a in one of the x-axis drive directions of the drive mass 202a. When the electrostatic actuators 204a cause movement of drive mass 202a in a first drive direction (e.g., in the negative x-direction), similarly configured electrostatic actuators 204b may cause movement of drive mass 202b in the positive x-direction, similarly configured electrostatic actuators 204c may cause movement of drive mass 202c in the positive x-direction, and similarly configured electrostatic actuators 204d may cause movement of drive mass 202d in the negative x-direction. When the electrostatic actuators 204a cause movement of drive mass 202a in a second drive direction (e.g., in the positive x-direction), similarly configured electrostatic actuators 204b may cause movement of drive mass 202b in the negative x-direction, similarly configured electrostatic actuators 204c may cause movement of drive mass 202c in the negative x-direction, and similarly configured electrostatic actuators 204d may cause movement of drive mass 202d in the positive x-direction.

In the exemplary embodiment of FIG. 6, springs 206a/206b/206c/206d may connect each of the drive masses 202a/202b/202c/202d to an associated lever arm 212a/212b/212c/212d. Each of the springs may be configured such that the drive motion imparted on the drive masses is transferred to the lever arm, for example, by maintaining a sufficient aspect ratio of the springs in the drive direction such that the drive masses effectively pull the lever arms in the drive direction. In an embodiment, the springs may have sufficient torsional compliance such that any out of plane motion of the lever arms (e.g., in response to an out-of-plane Coriolis force imparted upon the proof masses) is not coupled to the drive masses. In this manner, the drive motion, sense drive motion, and sense motion may remain decoupled.

Each of the lever arms 212a/212b/212c/212d may be coupled at a central point of the lever arm and on a shared axis with the springs 206a/206b/206c/206d, to a rigid masses 232a/232b/232c/232d via a respective t-shaped spring 210a/210b/210c/210d. As a respective spring 206a/206b/206c/206d pulls the lever arm in one direction along the x-axis drive axis, the lever arm is caused to rotate about the anchor within the MEMS device plane. The respective directions of movement of the drive masses may be coordinated such that each of the drive masses of a drive system of a gyroscope portion rotates in the same (clockwise or counterclockwise) direction. For example, when the spring 206a pulls lever arm 212a in a first direction (e.g., in the negative x-direction), lever arm 212a will rotate in a clockwise motion about anchor 208a. At the same time, spring 206b pulls lever arm 212b in the positive x-direction causing clockwise rotation of lever arm 212b, spring 206c pulls lever arm 212c in the positive x-direction causing a counter-clockwise rotation of lever arm 212c, and spring 206b pulls lever arm 212d in the negative x-direction causing a counter-clockwise rotation of lever arm 212d. Similarly, when the spring 206a pulls lever arm 212a in a second direction (e.g., in the positive x-direction), lever arm 212a will rotate in a counter-clockwise motion about anchor 208a. At the same time, spring 206b pulls lever arm 212b in the negative x-direction causing counter-clockwise rotation of lever arm 212b, spring 206c pulls lever arm 212c in the negative x-direction causing a clockwise rotation of lever arm 212c, and spring 206b pulls lever arm 212d in the positive x-direction causing a clockwise rotation of lever arm 212d. In addition to the relative movement of the lever arms being coordinated based on controlling the drive direction of each of the drive masses, these motions are coupled via a coupling spring 218 that connects the two gyroscope portions via proof masses 216b and 216c.

Each of the lever arms 212a/212b/212c/212d is connected to two proof masses via two proof mass springs (e.g., lever arm 212a is connected to proof mass 216a via proof mass spring 214a and proof mass 216b via proof mass spring 214b, lever arm 212b is connected to proof mass 216a via proof mass spring 214a and proof mass 216b via proof mass spring 214b, lever arm 212c is connected to proof mass 216c via proof mass spring 214c and proof mass 216d via proof mass spring 214d, and lever arm 212d is connected to proof mass 216c via proof mass spring 214c and proof mass 216d via proof mass spring 214d). Each of the proof mass springs is relatively rigid in the y-direction, such that the y-axis movement at the end of each lever arm in response to the rotation of the lever arm causes the proof mass to move in the y-direction. Movement of the proof masses in only the y-direction is further restricted because each proof mass is coupled to a respective lever arm at each of its ends.

In exemplary embodiments as described herein, when lever arms 212a and 212b are rotating in a clockwise direction, this will cause proof mass 216a to move in the positive y-direction and proof mass 216b to move in the negative y-direction. At the same time, lever arms 212c and 212d will rotate in a counter-clockwise direction, causing proof mass 216c to move in the negative y-direction and proof mass 216d to move in the positive y-direction. When lever arms 212a and 212b are rotating in a counter-clockwise direction, this will cause proof mass 216a to move in the negative y-direction and proof mass 216b to move in the positive y-direction. At the same time, lever arms 212c and 212d will rotate in a clockwise direction, causing proof mass 216c to move in the positive y-direction and proof mass 216d to move in the negative y-direction. The movement of the proof masses of each of the gyroscope portions is further restricted by coupling spring 218, which is configured to be rigid in the y-direction such that proof masses 216b and 216c should generally move in unison, which also impacts movement of proof masses 216a and 216d via the lever arms.

Each of the proof masses 216a/216b/216c/216d may form a sense capacitor with a respective in-plane drive sense electrode 240a/240b/240c/240d. Although the drive sensing may be performed in a variety of suitable manners (e.g., piezoelectric sensing, capacitive sensing, optical sensing, etc.) based on measured movement of a variety of suitable components (e.g., lever arms 212a/212b/212c/212d), in an embodiment drive sensing may be formed by respective comb fingers that extend along the y-axis (e.g., in the sense drive direction) from the proof masses 216a/216b/216c/216d and that are interdigitated with complementary combs of anchored drive sense electrodes 240a/240b/240c/240d. As the proof masses move along the y-axis, the differential capacitance at each of the sets of drive sense electrodes will change in a manner that is proportional to the movement of the proof masses along the y-axis. These drive sense signals may be provided in an open-loop or closed-loop feedback system to adjust the signals that are provided to the drive electrodes 204a/204b/204c/204d, e.g., to better balance the drive motion imparted upon the drive masses or to adjust the overall degree of movement that is imparted by the drive system.

As described herein, rotation about the measured axis (e.g., about the x-axis) may cause a Coriolis force along the z-axis when the proof masses are oscillating in the y-axis. Because the two proof masses of each of the gyroscope portions are always moving in the opposite direction, one of the proof masses of each of the gyroscope portions will experience a Coriolis force in the positive z-direction while the other of the proof masses will experience a Coriolis force in the negative z-direction, with the respective direction of the Coriolis force dependent on the y-axis direction of movement of the proof mass and the direction of the rotation about the axis. This will cause one of the proof masses to move out of plane in the positive z-direction and the other of the proof masses to move out of plane in the negative z-direction. These forces will cause a rotation of the lever arms of each of the gyroscope portions about the y-axis, via torsional movement of the spring and spring attached to each of the lever arms. In embodiments where the drive motions of the gyroscope portions and/or the coupling spring connects proof masses of the gyroscope portions, the lever arms of the respective gyroscope should rotate about the y-axis such that proof masses 216a and 216d move in unison out of plane, and such that proof masses 216b and 216c move in unison out of plane.

FIG. 7 also depicts sense electrodes 220a/220b/220c/220d associated with respective proof masses 216a/216b/216c/216d. Each of the sense electrodes may be fixed on another layer of the gyroscope (e.g., on a parallel substrate layer located below the proof masses). Each of the sense electrodes may form a capacitor with its associated proof mass, and may have a capacitance that changes based on the z-axis distance between the sense electrode and associated proof mass. Differential measurement of the capacitances sensed at the respective sense electrodes may be determined, and based on known correlations and scaling factors, angular velocity may be determined based on the movements of the proof masses.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

It will be understood that the configurations of masses, springs, levers, anchors, electrodes, and similar components are exemplary only and that various configurations from multiple figures may be combined in suitable manners. It will further be understood that other suitable modifications, additions, removals, optimizations, or variations may be implemented by a person having ordinary skill in the art or as is described herein.

What is claimed is:

1. A microelectromechanical (MEMS) sensor, comprising:
    a substrate;
    at least one anchoring component;
    a spring-mass system suspended from the at least one anchoring component, comprising:
        at least one sense mass, wherein the at least one sense mass moves in response to a sensed inertial force;
        a rigid mass coupled to the at least one anchoring component by at least one anchoring spring, wherein the at least one sense mass is coupled to the at least one anchoring component via the rigid mass and the anchoring spring, and wherein the rigid mass is substantially stationary during the operation of the MEMS sensor and in response to the sensed inertial force, wherein the at least one anchoring component and the spring-mass system are located within a MEMS layer of the MEMS sensor, and wherein the substrate is located below the MEMS layer and parallel to the MEMS layer.

2. The MEMS sensor of claim 1, wherein the rigid mass remains substantially stationary within the MEMS layer in response to a movement of the at least one anchoring component outside of the MEMS layer.

3. The MEMS sensor of claim 2, wherein the anchoring spring is torsionally compliant to the movement of the at least one anchoring component outside of the MEMS layer.

4. The MEMS sensor of claim 3, wherein the anchoring spring does not move within the MEMS layer in response to the movement of the at least one anchoring component.

5. The MEMS sensor of claim 4, wherein the anchoring spring does not move perpendicular to the MEMS layer in response to the movement of the at least one anchoring component.

6. The MEMS sensor of claim 2, wherein the substantially stationary rigid mass in response to the movement of the at least one anchoring component comprises a movement of the rigid mass outside of the MEMS layer that is at least an order of magnitude less than the movement of the at least one anchoring component outside of the MEMS layer.

7. The MEMS sensor of claim 1, wherein the substantially stationary rigid mass in response to the sensed inertial force comprises a movement of the rigid mass in response to the sensed inertial force that is at least an order of magnitude less than the movement of the at least one sense mass in response to the sensed inertial force.

8. The MEMS sensor of claim 1, wherein the spring-mass system further comprises at least one drive component, wherein the at least one drive component causes a drive force to be applied to the spring-mass system, and wherein the rigid mass is substantially stationary in response to the drive force.

9. The MEMS sensor of claim 8, wherein the substantially stationary rigid mass in response to the drive force comprises a movement of the rigid mass in response to the drive force that is at least an order of magnitude less than the movement of the at least one sense mass in response to the drive force.

10. The MEMS sensor of claim 1, wherein the spring-mass system further comprises at least one lever arm, and wherein the at least one lever arm is coupled to the at least one anchoring component via the rigid mass and the anchoring spring.

11. The MEMS sensor of claim 10, wherein the at least one sense mass is coupled to the at least one rotational mass by a spring.

12. The MEMS sensor of claim 11, wherein the at least one sense mass moves in a linear motion in response to a rotation of the at least one lever arm.

13. The MEMS sensor of claim 12, wherein the spring-mass system and the at least one anchoring component are located within a MEMS layer of the MEMS sensor, and wherein the rotation of the at least one lever arm and the linear motion of the at least one sense mass are within the MEMS layer.

14. The MEMS sensor of claim 13, wherein a drive force is applied to the at least one lever arm to cause the rotation of the at least one lever arm.

15. The MEMS sensor of claim 14, wherein the drive force is applied to a drive mass, and wherein the drive mass is coupled to the lever arm by a drive spring.

16. The MEMS sensor of claim 15, further comprising:
at least one second anchoring component, wherein the spring-mass system is suspended from the at least one second anchoring component, and wherein the spring-mass system further comprises:
a second rigid mass coupled to the at least one second anchoring component by at least one second anchoring spring, wherein the at least one drive mass is coupled to the at least one second anchoring component via the second rigid mass and the second anchoring spring, and wherein the second rigid mass is substantially stationary during the operation of the MEMS sensor and in response to the sensed inertial force.

17. The MEMS sensor of claim 16, wherein the at least one second anchoring component and the spring-mass system are located within a MEMS layer of the MEMS sensor, and wherein the second rigid mass remains substantially stationary within the MEMS layer in response to a movement of the at least one second anchoring component outside of the MEMS layer.

18. The MEMS sensor of claim 13, wherein the sense mass moves perpendicular to the MEMS layer in response to the sensed inertial force.

19. A microelectromechanical (MEMS) sensor, comprising:
a substrate;
a MEMS layer located above the substrate and parallel to the substrate, the MEMS layer comprising;
an anchoring component;
a rigid mass, wherein the anchoring component is coupled to the anchoring component by an anchoring spring, wherein the anchoring spring is substantially compliant to a displacement of the anchoring component;
an active mass coupled to the rigid mass by at least one spring, wherein the active mass is configured to move in response to a drive force or a sense force applied to the MEMS sensor, and wherein a lower plane of the active mass is substantially parallel to the substrate in response to the displacement of the anchoring component.

20. A microelectromechanical (MEMS) sensor, comprising:
a substrate;
a MEMS layer located above the substrate and parallel to the substrate, comprising:
a plurality of anchoring components, wherein one or more of the plurality of anchoring components is located at an angle relative to the the upper or lower plane of the MEMS layer;
a plurality of active masses, wherein each of the plurality of active masses is configured to move in response to a drive force or a sense force applied to the MEMS sensor; and
a plurality of rigid masses, wherein one or more of the plurality of rigid masses is directly coupled to one or more the anchoring components by an anchoring spring, wherein one or more of the plurality of rigid masses is directly coupled to one or more of the active masses by a spring, wherein none of the active masses is directly coupled to any of the plurality of anchoring components, and wherein each of the plurality of active masses includes a plane that faces the substrate and is substantially parallel to the substrate.

* * * * *

UNITED STATES PATENT AND TRADEMARK OFFICE
CERTIFICATE OF CORRECTION

PATENT NO. : 10,655,963 B2
APPLICATION NO. : 15/899906
DATED : May 19, 2020
INVENTOR(S) : Jaakko Ruohio et al.

It is certified that error appears in the above-identified patent and that said Letters Patent is hereby corrected as shown below:

Claim 20, Column 22, Line 18, delete first occurrence of "the"

Signed and Sealed this
Thirtieth Day of June, 2020

Andrei Iancu
*Director of the United States Patent and Trademark Office*